(12) United States Patent
Guevara et al.

(10) Patent No.: US 12,550,772 B2
(45) Date of Patent: Feb. 10, 2026

(54) SEMICONDUCTOR PACKAGE CONDUCTIVE TERMINALS WITH REDUCED PLATING THICKNESS

(71) Applicant: TEXAS INSTRUMENTS INCORPORATED, Dallas, TX (US)

(72) Inventors: Rafael Jose Lizares Guevara, Angeles (PH); Jose Arvin M. Plomantes, Dagupan (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 597 days.

(21) Appl. No.: 18/072,426

(22) Filed: Nov. 30, 2022

(65) Prior Publication Data
US 2024/0178166 A1    May 30, 2024

(51) Int. Cl.
*H01L 23/00* (2006.01)
(52) U.S. Cl.
CPC .............. *H01L 24/05* (2013.01); *H01L 24/03* (2013.01); *H01L 24/45* (2013.01); *H01L 24/85* (2013.01); *H01L 2224/03462* (2013.01); *H01L 2224/0347* (2013.01); *H01L 2224/05147* (2013.01); *H01L 2224/05155* (2013.01); *H01L 2224/05664* (2013.01); *H01L 2224/45644* (2013.01); *H01L 2224/85* (2013.01)

(58) Field of Classification Search
CPC ......... H01L 24/05; H01L 24/03; H01L 24/45; H01L 24/85; H01L 2224/03462; H01L 2224/0347; H01L 2224/05147; H01L 2224/05155; H01L 2224/05664; H01L 2224/45644; H01L 2224/85; H01L 24/48
See application file for complete search history.

(56) References Cited

U.S. PATENT DOCUMENTS

| | | | |
|---|---|---|---|
| 6,518,161 B1 * | 2/2003 | Rajagopalan | H01L 24/05 257/E21.705 |
| 2013/0181340 A1 * | 7/2013 | Uehling | H01L 24/11 257/737 |
| 2021/0066534 A1 * | 3/2021 | Koestler | H10F 10/142 |
| 2025/0105195 A1 * | 3/2025 | Molina | H01L 24/29 |

* cited by examiner

*Primary Examiner* — Douglas W Owens
(74) *Attorney, Agent, or Firm* — Dawn Jos; Frank D. Cimino

(57) ABSTRACT

In some examples, a method for manufacturing a semiconductor package comprises forming a copper member on a surface; applying a photoresist to the copper member and the surface; and forming a cavity in the photoresist above the copper member. The cavity has a first volume with a first diameter and a second volume with a second diameter larger than the first diameter. The second volume is more proximal to the copper member than the first volume. The method also includes forming a nickel member in the second volume forming a palladium member in the first volume.

12 Claims, 19 Drawing Sheets

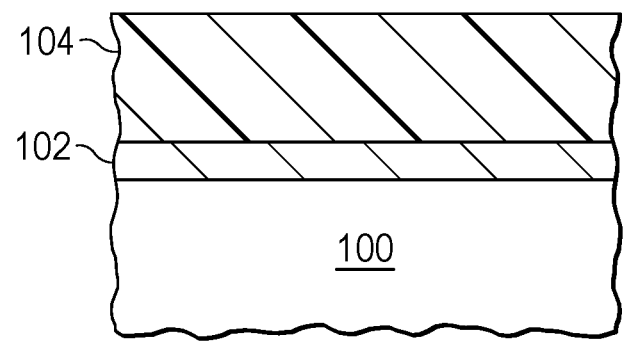
FIG. 1A1
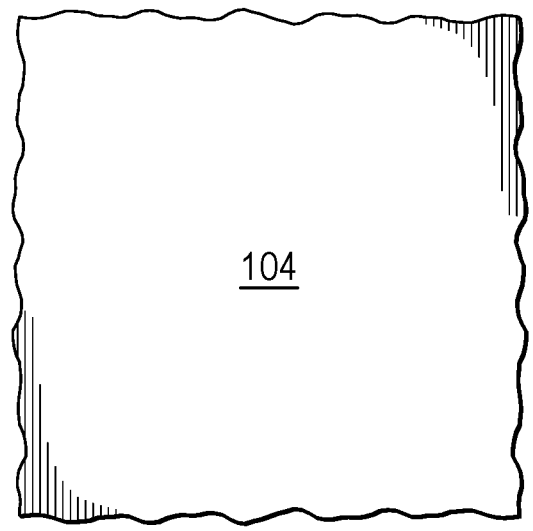
FIG. 1A2

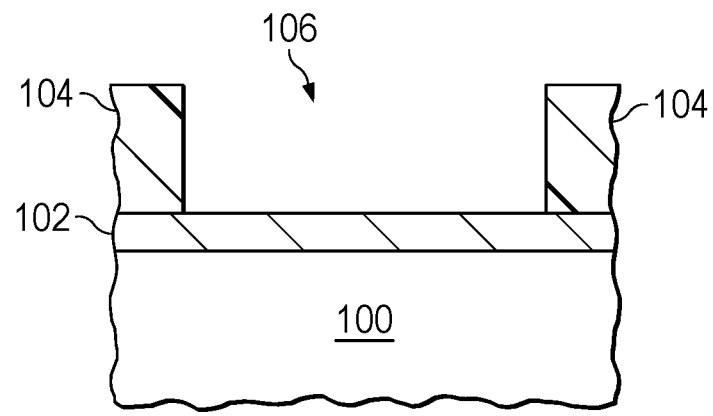
FIG. 1B1
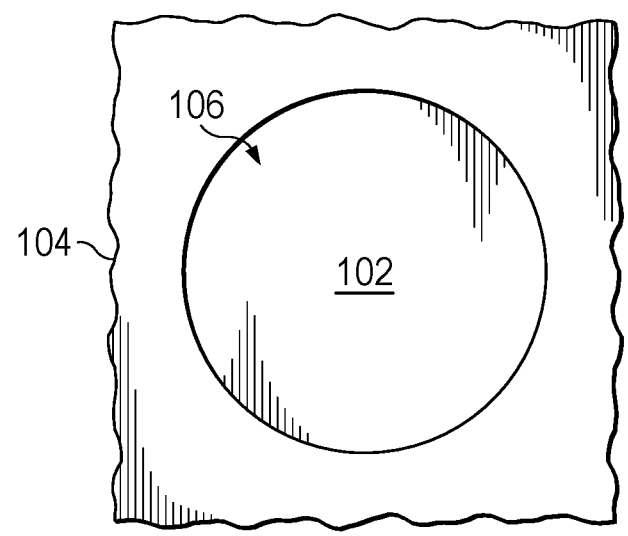
FIG. 1B2

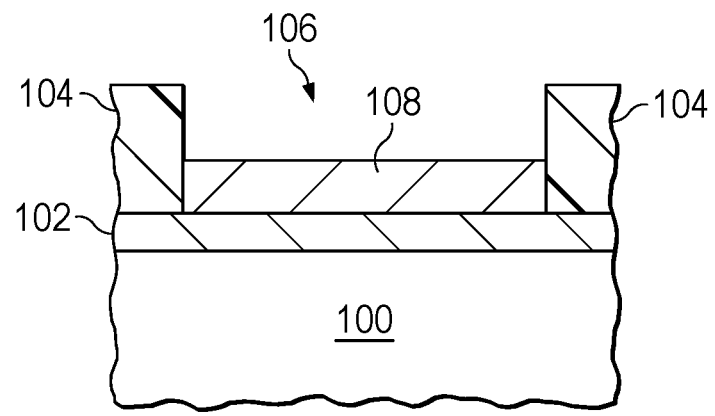
FIG. 1C1
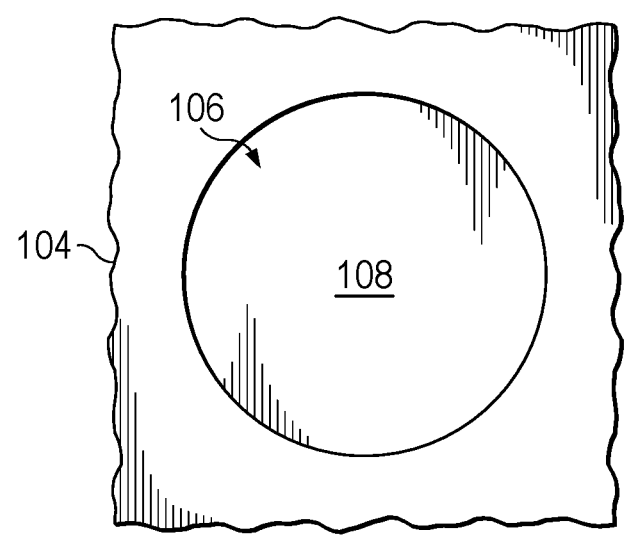
FIG. 1C2

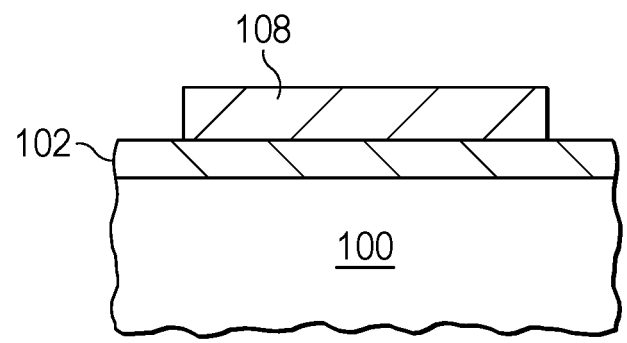
FIG. 1D1
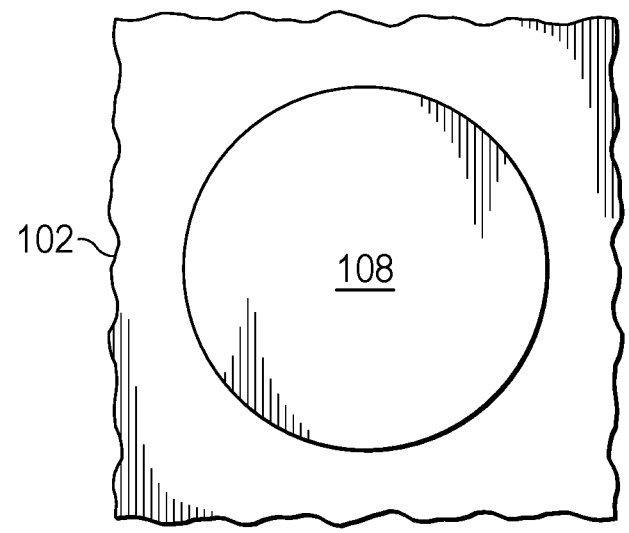
FIG. 1D2

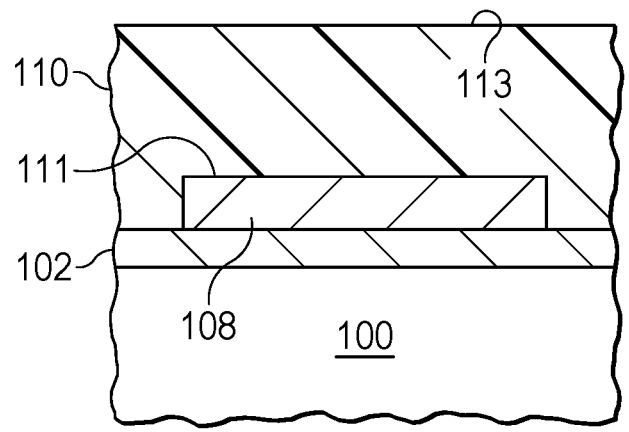
FIG. 1E1
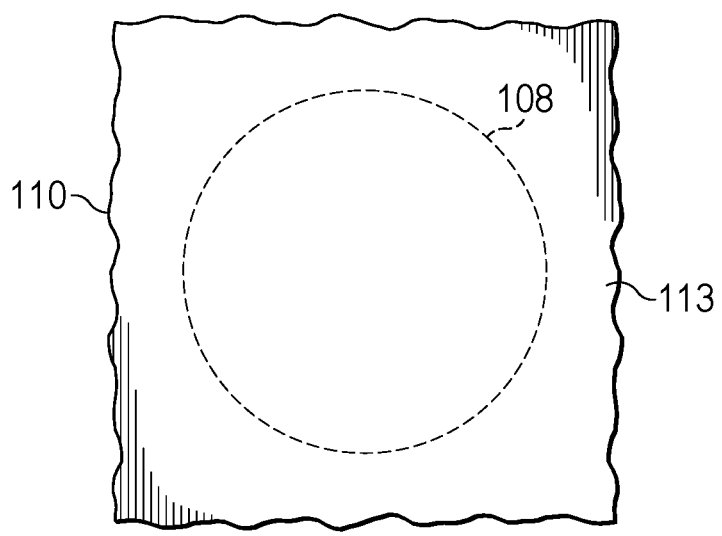
FIG. 1E2

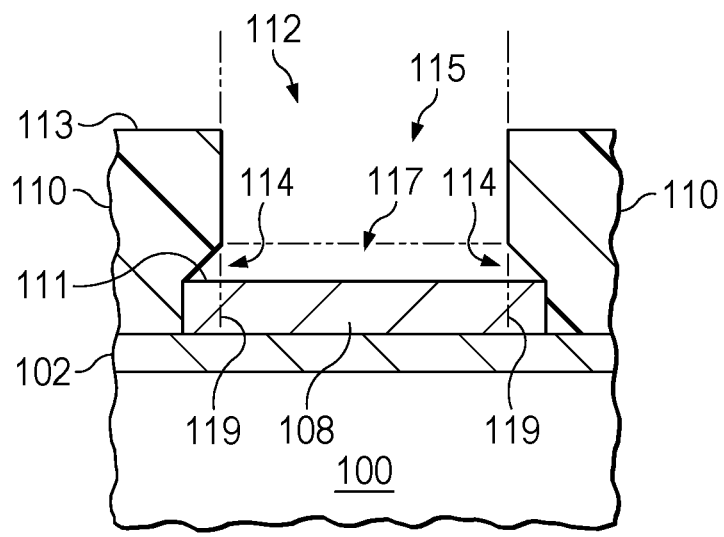
FIG. 1F1
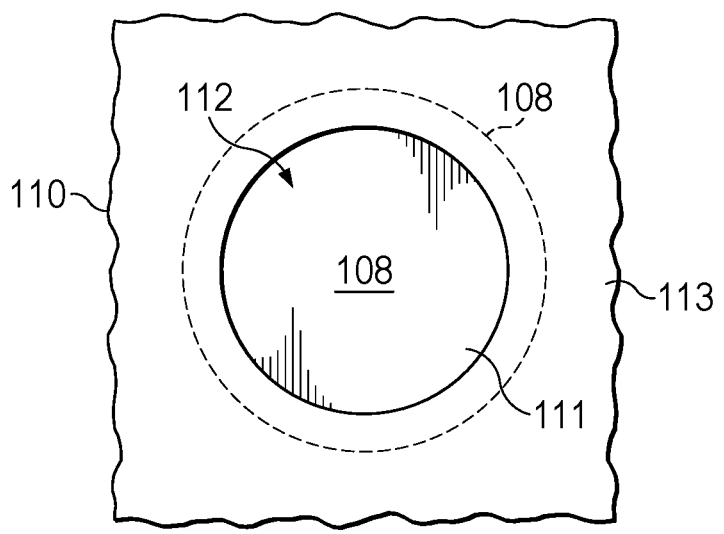
FIG. 1F2

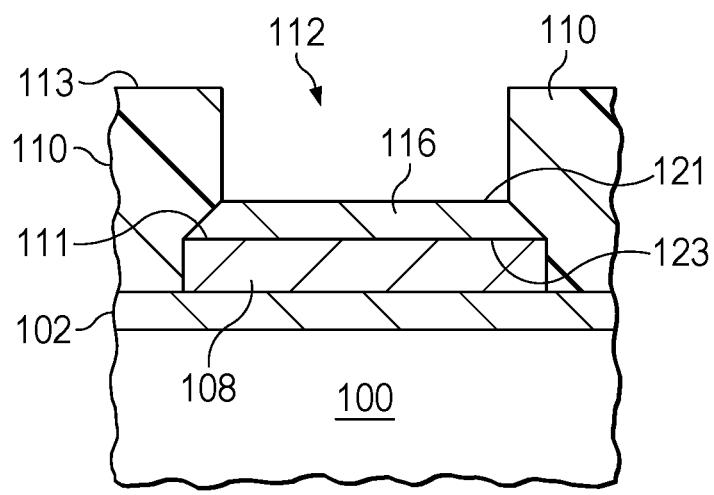
FIG. 1G1
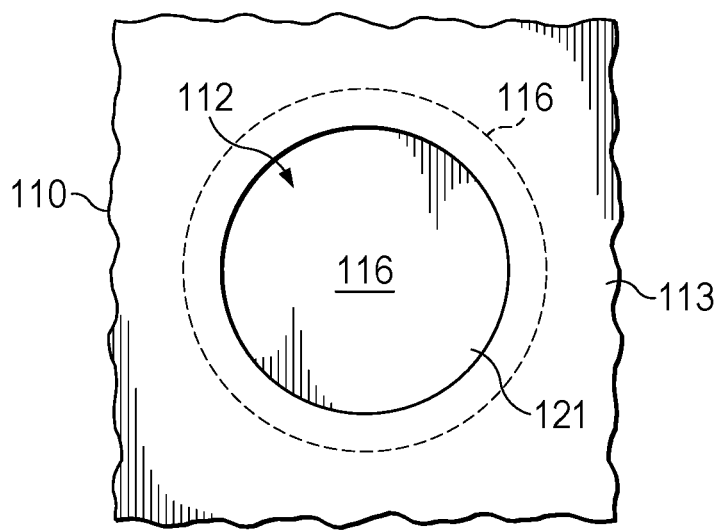
FIG. 1G2

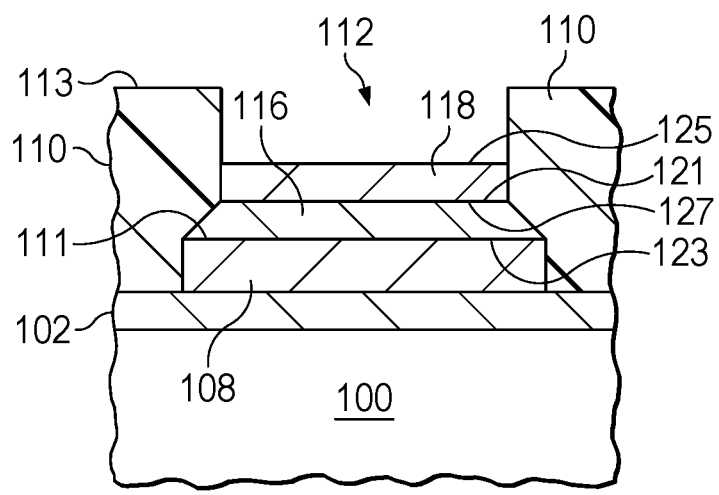
FIG. 1H1
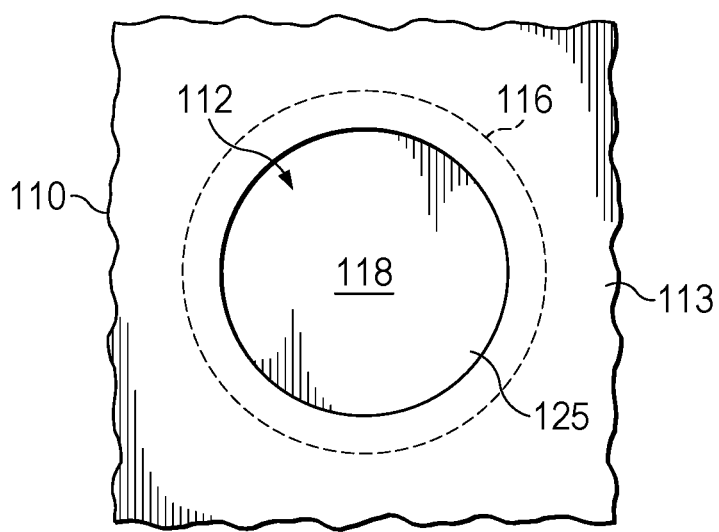
FIG. 1H2

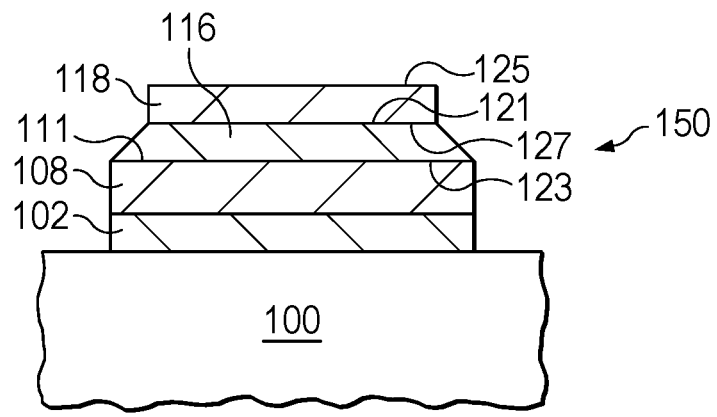
FIG. 1I1
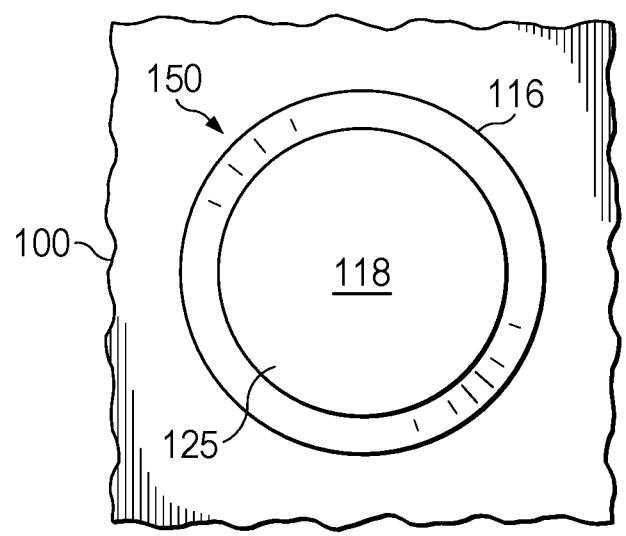
FIG. 1I2

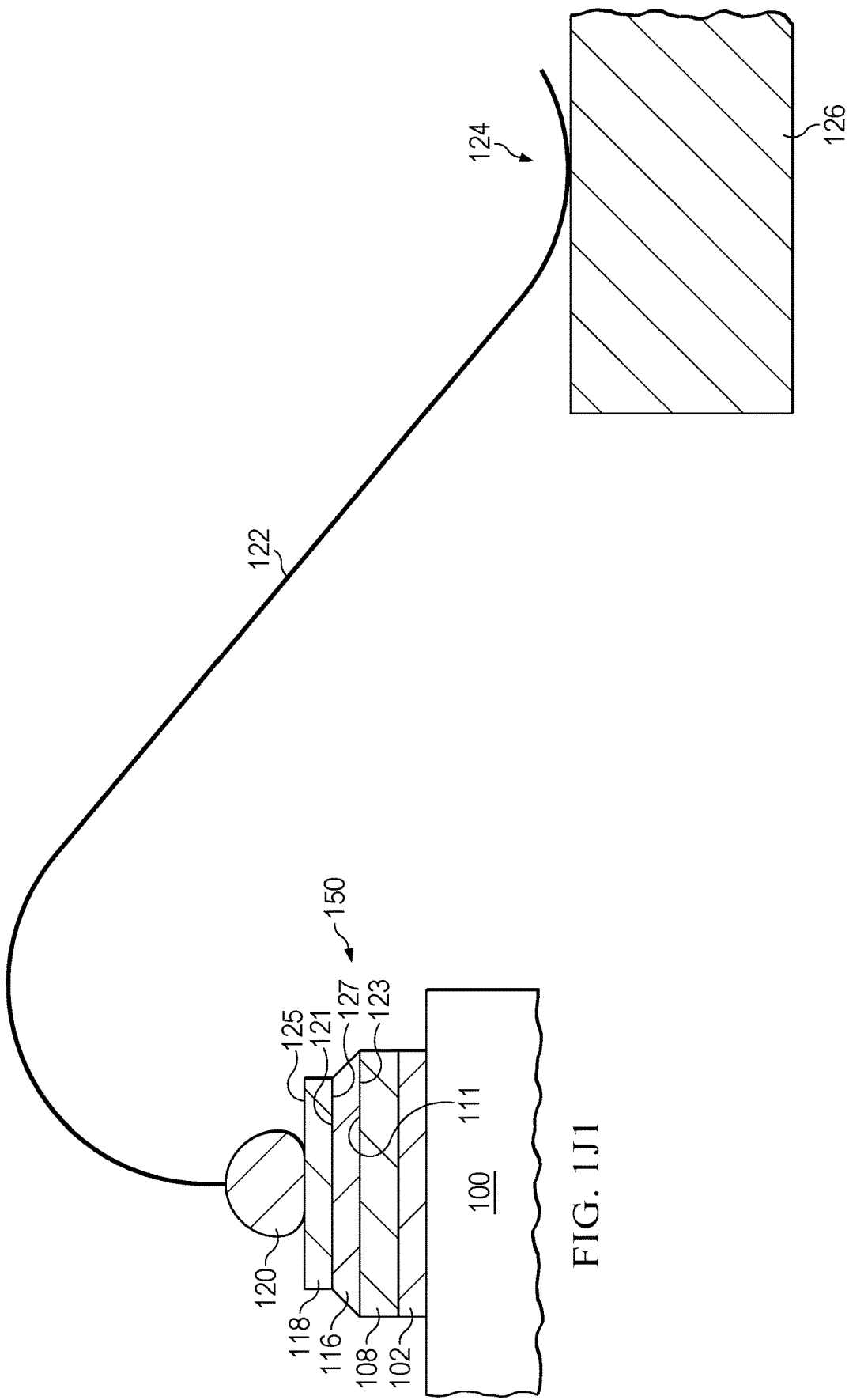
FIG. 1J1

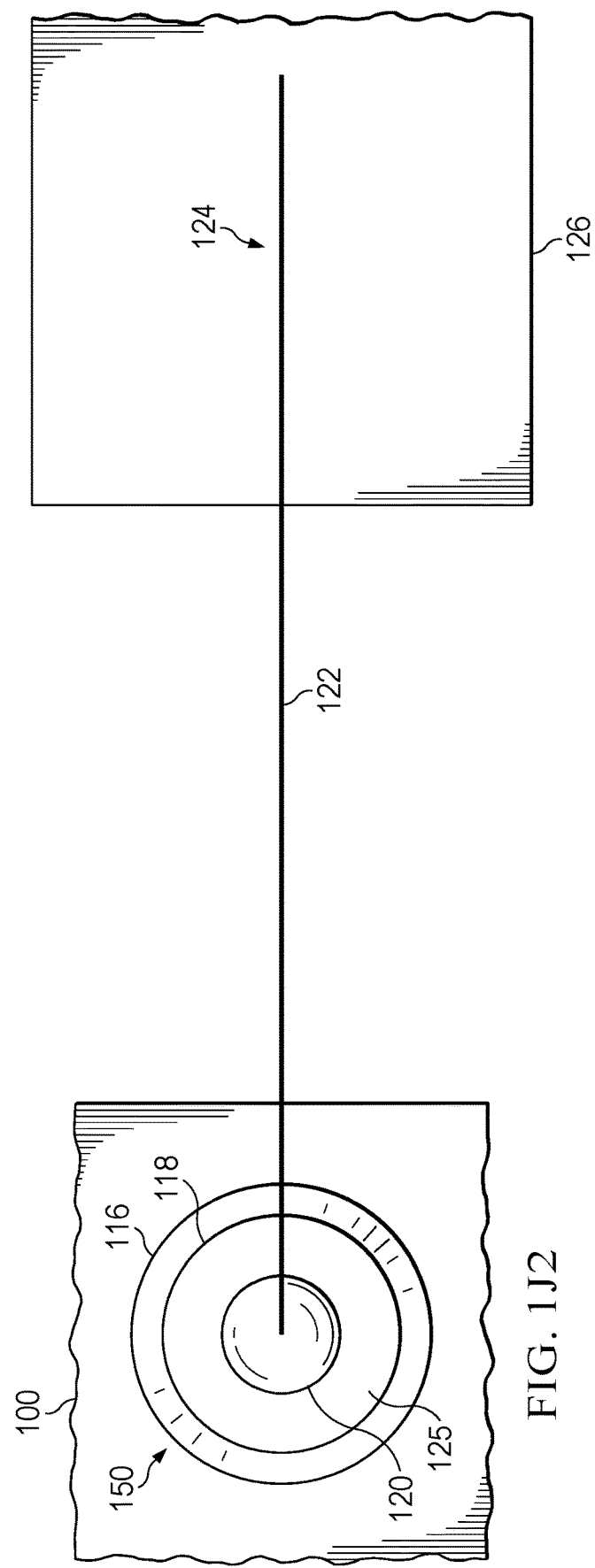
FIG. 1J2

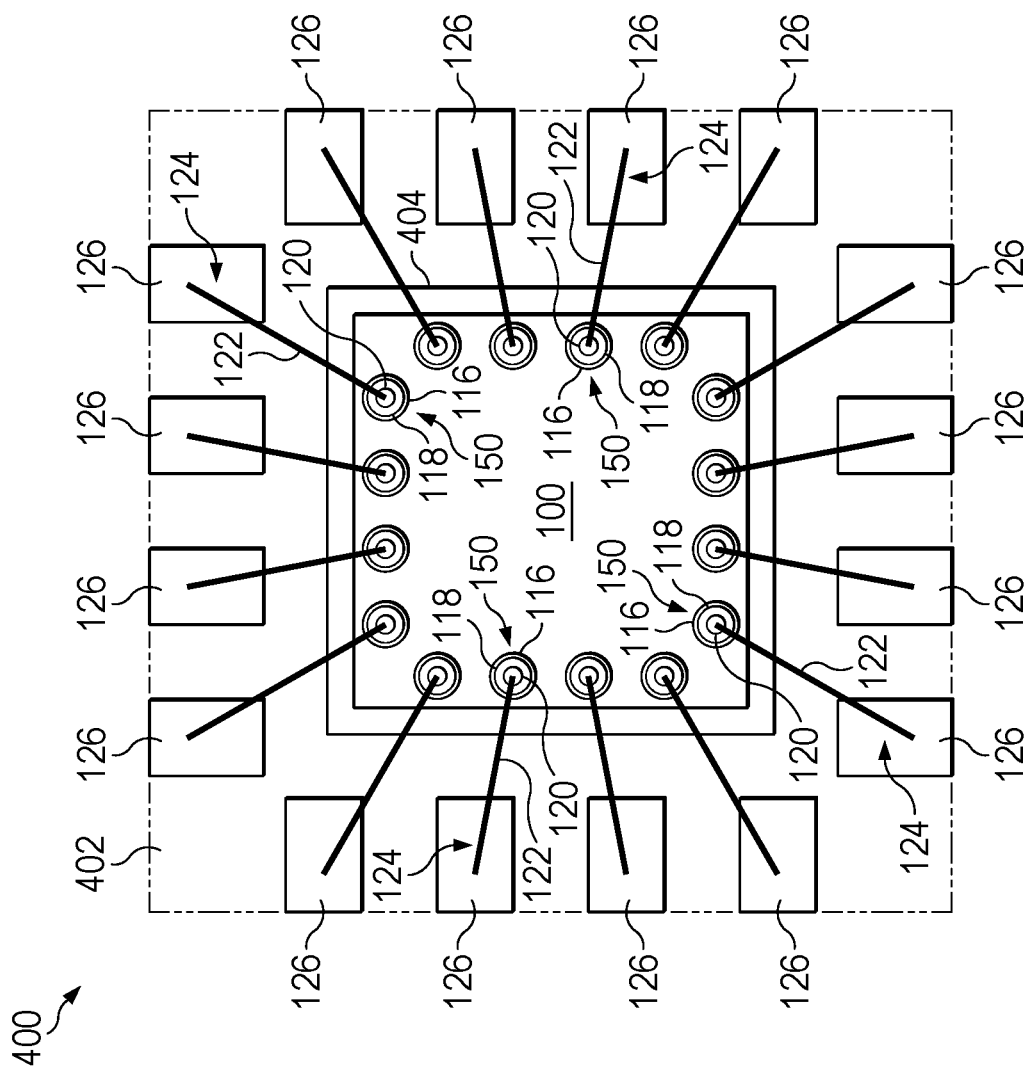

SEMICONDUCTOR PACKAGE CONDUCTIVE TERMINALS WITH REDUCED PLATING THICKNESS

BACKGROUND

During semiconductor chip manufacturing, circuits may be formed on a semiconductor wafer (or more simply "wafer"). The wafer may be separated (or "singulated") into a plurality of semiconductor dies, each die having a circuit formed thereon. Each die is then processed to form a semiconductor package that may be integrated with an electronic device (e.g., computers, smartphones). A semiconductor package may include a surface having copper conductive terminals (e.g., leads) that facilitate connections to other components. The semiconductor package may also include copper conductive terminals (e.g., bond pads) inside the package to facilitate connections between components within the package.

SUMMARY

In some examples, a method for manufacturing a semiconductor package comprises forming a copper member on a surface; applying a photoresist to the copper member and the surface; and forming a cavity in the photoresist above the copper member. The cavity has a first volume with a first diameter and a second volume with a second diameter larger than the first diameter. The second volume is more proximal to the copper member than the first volume. The method also includes forming a nickel member in the second volume forming a palladium member in the first volume.

In some examples, a semiconductor package comprises a copper member coupled to a circuit and a nickel member having first and second surfaces opposite each other. The first surface of the nickel member is coupled to the copper member, and the second surface of the nickel member has an area smaller than 95% of an area of the first surface of the nickel member. The package also includes a palladium member having first and second surfaces opposite each other, the first surface of the palladium member coupled to the second surface of the nickel member. The package also comprises a conductive member coupled to the second surface of the palladium member.

BRIEF DESCRIPTION OF THE DRAWINGS

FIGS. 1A1-1J2 are a process flow for manufacturing a semiconductor package, in accordance with various examples.

FIG. 2 is a flow diagram of a method for manufacturing a semiconductor package, in accordance with various examples.

FIGS. 4A-4C are cross-sectional, top-down, and perspective views of a non-leaded semiconductor package having conductive terminals with reduced plating size, in accordance with various examples.

DETAILED DESCRIPTION

Figure 2:
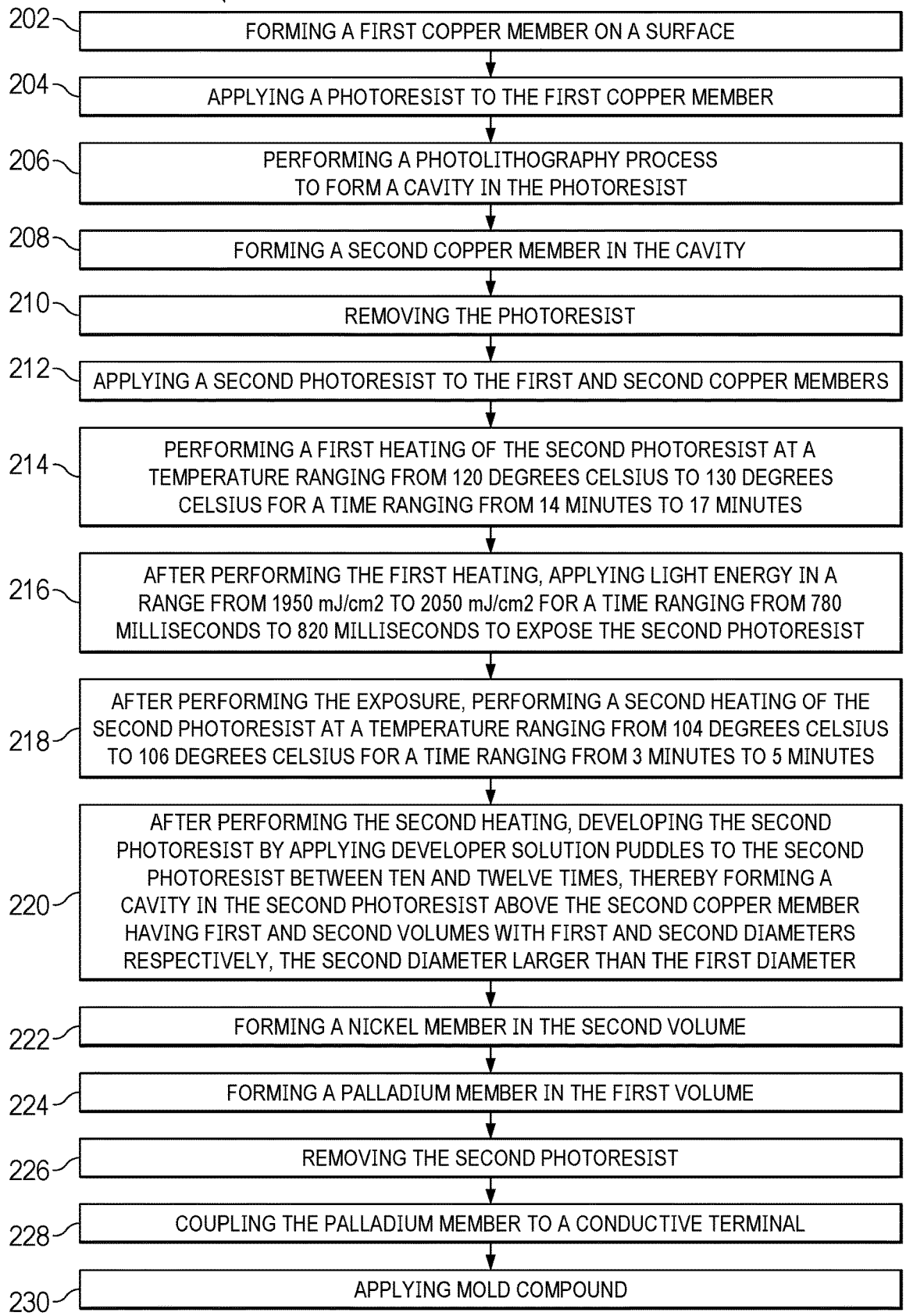

Within a semiconductor package, copper conductive terminals may be coated with nickel, as nickel is harder than copper, prevents copper diffusion, and is suitable for the formation of connections such as by wirebonding. Nickel is prone to oxidation and thus may be coated with palladium to operate as an oxidation barrier. Palladium is expensive, and thus it is desirable to reduce the amount of palladium used to coat the nickel member. However, reducing the size of the palladium member leaves at least some of the nickel member exposed and thus vulnerable to oxidation.

This disclosure describes various examples of a semiconductor package having conductive terminals with a specific structural configuration that mitigates the challenges described above. In particular, the semiconductor package reduces the amount of palladium used to coat the nickel member without leaving portions of the nickel member exposed. In this way, cost reductions are achieved by using less palladium while simultaneously preventing nickel oxidation. In examples, a semiconductor package comprises a copper member having first and second surfaces opposing each other and a nickel member having first and second surfaces opposing each other. The first surface of the nickel member has a same area as the second surface of the copper member, and the second surface of the nickel member has a smaller area than the first surface of the nickel member. The semiconductor package includes a palladium member having first and second surfaces opposing each other, where the first surface of the palladium member is coupled to and has a same area as the second surface of the nickel member. The semiconductor package includes a conductive member coupled to the second surface of the palladium member.

Such a semiconductor package may be manufactured by forming a copper member on a surface; applying a photoresist to the copper member and the surface; and performing a first heating of the photoresist at a temperature ranging from 120 degrees Celsius to 130 degrees Celsius for approximately 6 minutes. The method includes, after performing the first heating, applying light energy in a range from 1950 milliJoules per centimeter squared to 2050 milliJoules per centimeter squared for approximately 800 milliseconds per shot to expose the photoresist. The method includes, after performing the exposure, performing a second heating of the photoresist at a temperature ranging from 104 degrees Celsius to 106 degrees Celsius for approximately 4 minutes. The method includes, after performing the second heating, developing the photoresist by applying developer solution puddles to the photoresist between 10 times and 12 times. The developer solution may include tetramethyl ammonium hydroxide, and application of the puddles may entail oscillation rather than uni-directional spin. The performance of the first heating, the exposure, the second heating, and the developing produce a cavity in the photoresist above the copper member, the cavity having a first volume with a first diameter and a second volume with a second diameter larger than the first diameter, the second volume more proximal to the copper member than the first volume. The method includes forming a nickel member in the second volume and forming a palladium member in the first volume. Such structures and methods represent a technical solution to the technical problem of reducing the amount of palladium used without exposing the underlying nickel member to ambient conditions and risking oxidation.

FIGS. 1A1-1J2 are a process flow for manufacturing a semiconductor package, in accordance with various examples. FIG. 2 is a flow diagram of a method 200 for manufacturing a semiconductor package, in accordance with various examples. Accordingly, the process flow of FIGS. 1A1-1J2 and the flow diagram of FIG. 2 are now described in parallel.

The method 200 begins with forming a first copper member on a surface (202). The method 200 also includes applying a photoresist to the first copper member (204). FIG. 1A1 is a cross-sectional view of part of a semiconductor die 100. The area of the semiconductor die 100 shown in FIG. 1A1 may be an area on which a conductive terminal, such as a bond pad, is to be formed. A copper member, such as a seed layer 102 (e.g., a copper seed layer), is deposited on the semiconductor die 100. In examples, the seed layer 102 is formed on a device side of the semiconductor die 100, such as a side of the semiconductor die in which circuitry is formed. For example, the process flow of FIGS. 1A1-1J2 may be useful to form conductive terminals (e.g., bond pads) on a device side of a semiconductor die 100. In some examples, numeral 100 represents a substrate on which a conductive terminal is formed according to the process flow of FIGS. 1A1-1J2, and the conductive terminal is subsequently removed from the substrate and coupled to a device side of a semiconductor die, such as at a bond pad location. Any and all such examples and variations are contemplated and included in the scope of this disclosure. Further, a photoresist layer 104 is applied to the seed layer 102. The photoresist layer 104 has a thickness ranging from 20 to 30 microns, with a thickness below this range being disadvantageous because it does not provide adequate photoresist volume to form the specific plating shapes (e.g., nickel and palladium plating shapes) described herein, and with a thickness above this range being disadvantageous because it results in an overuse of precious metal, such as palladium, thereby defeating a key motivator for the specific plating structures described herein. FIG. 1A2 is a top-down view of the structure of FIG. 1A1.

The method 200 includes performing a photolithography process to form a cavity in the photoresist (206). FIG. 1B1 is a cross-sectional view of the structure of FIG. 1A1, but with a cavity 106 having been formed in the photoresist layer 104 by way of a photolithographic process. The cavity 106 has a smallest horizontal dimension (e.g., diameter) of at least 70 microns. A smallest horizontal dimension below this range is disadvantageous because it may result in a palladium member (described below) size that is inadequate for ball bond formation. FIG. 1B2 is a top-down view of the structure of FIG. 1B1.

The method 200 includes forming a second copper member in the cavity (208). FIG. 1C1 is a cross-sectional view of the structure of FIG. 1B1, but with a second copper member 108 formed in the cavity 106. The smallest horizontal dimension of the second copper member 108 is within the range provided above for the cavity 106. FIG. 1C2 is a top-down view of the structure of FIG. 1C1.

The method 200 includes removing the photoresist (210). FIG. 1D1 shows the photoresist layer 104 having been stripped away. Any suitable technique may be useful to remove the photoresist layer 104. FIG. 1D2 is a top-down view of the structure of FIG. 1D1.

The method 200 includes applying a second photoresist to the first and second copper members (212). FIG. 1E1 shows a second photoresist layer 110 applied to the seed layer 102 and to the second copper member 108. The portion of the second photoresist layer 110 between the top surface 111 of the second copper member 108 and the top surface 113 of the second photoresist layer 110 has a thickness ranging from 10 to 20 microns with a thickness below this range being disadvantageous because it does not provide adequate photoresist volume to form the specific plating shapes (e.g., nickel and palladium plating shapes) described herein, and with a thickness above this range being disadvantageous because it results in an overuse of precious metal, such as palladium, thereby defeating a key motivator for the specific plating structures described herein. FIG. 1E2 is a top-down view of the structure of FIG. 1E1.

The method 200 comprises performing a first heating (also referred to as a first "bake") of the second photoresist (e.g., the second photoresist layer 110) at a temperature ranging from 120 degrees Celsius to 130 degrees Celsius for a time ranging from approximately 14 minutes to approximately 17 minutes (214). Applying a temperature lower than this range is disadvantageous because heat flux and thermal conductivity is negatively impacted, and applying a temperature greater than this range is disadvantageous because it decomposes a fraction of the photoactive compound; the low solvent concentration embrittles the resist film making it susceptible to cracking. Applying heat for a lesser duration of time is disadvantageous because there is unoptimized carboxylic acid formation leading to poor adhesion, and applying heat for a greater duration of time is disadvantageous because it eliminates most of the solvent still needed for exposure and development. The method 200 also comprises, after performing the first heating, applying light energy in a range from 1950 milli Joules/cm$^2$ to 2050 milli Joules/cm$^2$ (the cm$^2$ denoting the area of top surface 113) for a time ranging from 780 milliseconds to 820 milliseconds to expose the second photoresist (216). Applying light of a lesser energy than this range is disadvantageous because there is not enough energy to penetrate the resist thickness and applying light of a greater energy than this range is disadvantageous because the excess light disperses in the photoresist. Applying light for a shorter duration than the specified time range is disadvantageous because it is unacceptably inefficient in the manufacturing process, and applying light for a longer duration than the specified time range is disadvantageous because it can lead to thermal or mechanical damage. In step (216), the light energy is applied in a targeted area of the top surface 113 using a mask or other suitable apparatus (not expressly shown).

The method 200 comprises, after performing the exposure, performing a second heating (also referred to as a second "bake") of the second photoresist at a temperature ranging from 104 degrees Celsius to 106 degrees Celsius for a time ranging from approximately 3 minutes to approximately 5 minutes (218). A second bake that is performed at a lower temperature than this range is disadvantageous because catalysis is hampered, and a second bake performed at a higher temperature than this range is disadvantageous because it can lead to mechanical damage. A second bake that is performed for a duration shorter than the specified range is disadvantageous because it produces low soluble carboxylic acid and leaves more of the insoluble photoactive compound leading to photoresist scumming, and a second bake that is performed for a duration longer than the specified range is disadvantageous because it leads to photoresist lifting. The method 200 comprises, after performing the second bake, developing the second photoresist (e.g., the portion of the photoresist that has already been exposed in step (216)) by applying developer solution puddles to the second photoresist between 10 and 12 times, thereby forming a cavity in the second photoresist above the second copper member (220). The cavity in the second photoresist has first and second volumes with first and second diameters, respectively (220). The second diameter is larger than the first diameter (220). Performance of steps 214, 216, 218, and 220 results in the structure shown in FIG. 1F1. Specifically, FIG. 1F1 is a cross-sectional view showing a cavity 112 having a recessed area 114. (Although FIG. 1F1 depicts what appears to be multiple recessed areas 114, this is due to the cross-sectional view that FIG. 1F1 provides. The structure of FIG. 1F1 actually includes a single recessed area 114 that extends along the circumference or perimeter of the cavity 112.) The recessed area 114 is formed during the performance of steps 214, 216, 218, and 220 because the first bake, exposure, second bake, and development are all performed within the specific parameters described above. Performance of one or more of the steps 214, 216, 218, and/or 220 outside of the specific parameters provided above will result in malformation of the cavity 112, including malformation or non-formation of the recessed area 114. The cavity 112 may be considered to have two separate volumes: a first volume 115 and a second volume 117. The second volume 117 is coincident with the recessed area 114 and thus is larger (e.g., has larger dimensions, such as diameter) than the first volume 115, which is above the recessed area 114 and has smaller dimensions, such as diameter. FIG. 1F2 is a top-down view of the structure of FIG. 1F1.

The method 200 includes forming a nickel member in the second volume (222). FIG. 1G1 is a cross-sectional view showing a nickel member 116 in the second volume 117. In examples, the nickel member 116 is electroplated. The horizontal depth of the recessed area 114 as measured from a cylinder 119, whose wall is coincident with the wall of the first volume 115, is no greater than 10 microns, as depths greater than this will prevent electroplating of a nickel member 116 that completely fills the second volume 117. As shown, the nickel member 116 takes the shape of the second volume 117, assuming the nickel member 116 is plated to fill most or all of the second volume 117. The nickel member 116 has a top surface 121 and a bottom surface 123, with the bottom surface 123 having a larger area than the top surface 121. The bottom surface 123 has an area ranging from 4000 microns$^2$ to 5000 microns$^2$, with a smaller area than this range being disadvantageous because the margin for wirebond landing will be unacceptably small, and with a larger area than this range being disadvantageous because the additional space will not be required and will thus occupy space unnecessarily. The top surface 121 has an area ranging from 3000 microns$^2$ to 3500 microns$^2$, with a smaller area than this range being disadvantageous because the margin for wirebond landing will be unacceptably small, and with a larger area than this range being disadvantageous because the additional space will not be required and will thus occupy space unnecessarily. The area of the top surface 121 is 90-95% of the area of the bottom surface 123, with a difference in areas smaller than this range being disadvantageous because the margin for wirebond landing will be unacceptably small, and with a difference in areas larger than this range being disadvantageous because the additional space will not be required and will thus occupy space unnecessarily. The nickel member 116 has a thickness ranging from 2 microns to 5 microns, with a thickness below this range being disadvantageous because it is insufficient to act as a diffusion barrier, and with a thickness above this range being disadvantageous because of unacceptably and needlessly higher costs. In examples, metals other than nickel may be useful to fill the second volume 117. Any metal used to fill the second volume 117 should resist corrosion, thus protecting the underlying second copper member 108. FIG. 1G2 is a top-down view of the structure of FIG. 1G1.

The method 200 includes forming a palladium member in the first volume (224). FIG. 1H1 is a cross-sectional view of the structure of FIG. 1G1, except with a palladium member 118 formed in the first volume 115. In examples, the palladium member 118 fills the first volume 115 completely, and in other examples, the palladium member 118 fills the first volume 115 only partially. In examples, the palladium member 118 is electroplated. In some examples, a precious metal other than palladium may be useful. The thickness of the palladium member 118 ranges from 0.1 microns to 0.5 microns, with a palladium member 118 thinner than this range being disadvantageous because this might lead to wirebond issues like ball fly off, and with a palladium member 118 thicker than this range being disadvantageous because of the needlessly and unacceptably increased cost of palladium. The area of a top surface 125 is approximately equivalent to the area of a bottom surface 127, and this area is the smallest area that can accommodate a ball bond or other suitable bond used in a particular implementation. FIG. 1H2 is a top-down view of the structure of FIG. 1H1.

The method 200 includes removing the second photoresist (226). FIG. 1I1 shows the structure of FIG. 1H1, but with the second photoresist layer 110 removed (e.g., stripped). FIG. 1I2 is a top-down view of the structure of FIG. 1I1. The completed structure of FIGS. 1I1 and 1I2, except for the semiconductor die 100, may be referred to herein as a conductive member 150.

The method 200 includes coupling the palladium member to a conductive terminal (228). In examples, such coupling is performed by wirebonding. In examples, a solder ball may be useful to directly couple the palladium member 118 to a conductive terminal. FIG. 1J1 is a cross-sectional view of the semiconductor die 100 and the conductive member 150 of FIG. 1I1, but with a ball bond 120 coupled to the palladium member 118 at top surface 125. A bond wire 122 couples the ball bond 120 to a stitch bond 124 on conductive terminal 126. In examples, the ball bond 120, bond wire 122, and/or stitch bond 124 comprise gold, although other metals may be useful. In examples, conductive terminals include leads, such as in a leaded semiconductor package (e.g., a dual inline package (DIP)). In examples, conductive terminals include pins of a quad flat no lead (QFN) package. Other types of packages are contemplated and included in the scope of this disclosure. FIG. 1J2 is a top-down view of the structure of FIG. 1J1.

Figure 3A:
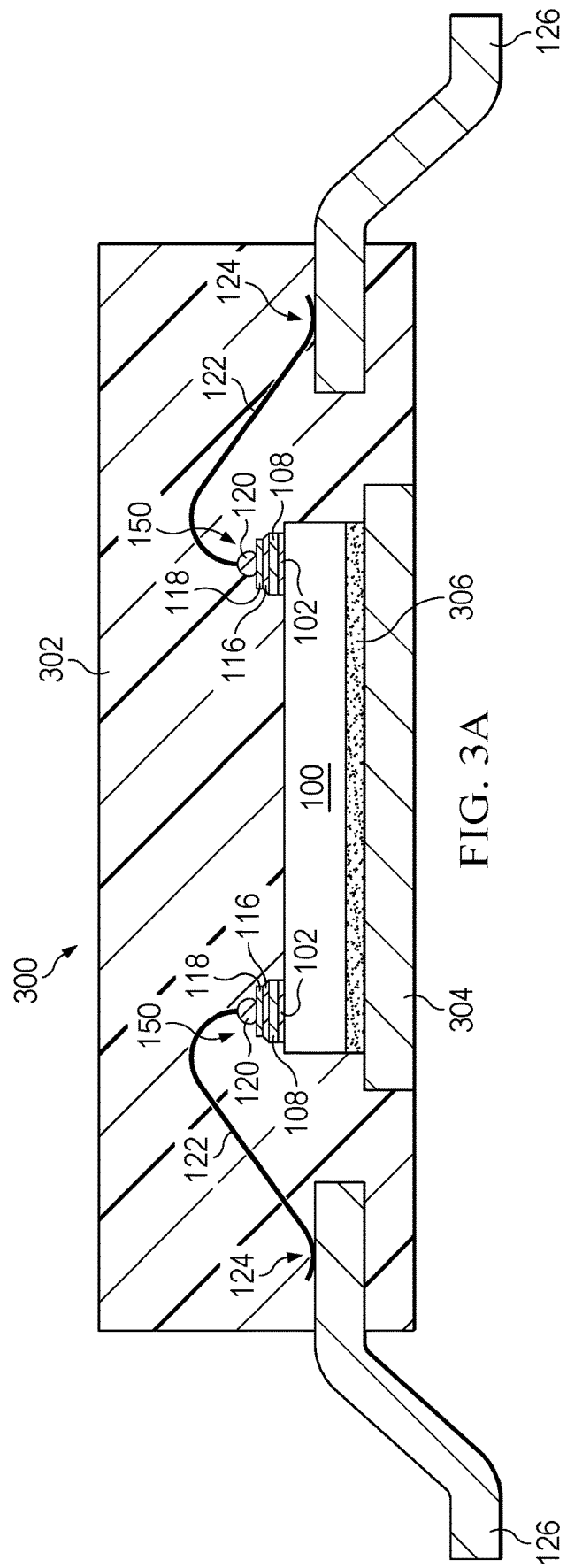
FIGS. 3A-3C are cross-sectional, top-down, and perspective views of a leaded semiconductor package having conductive terminals with reduced plating size, in accordance with various examples.
Figure 3B:
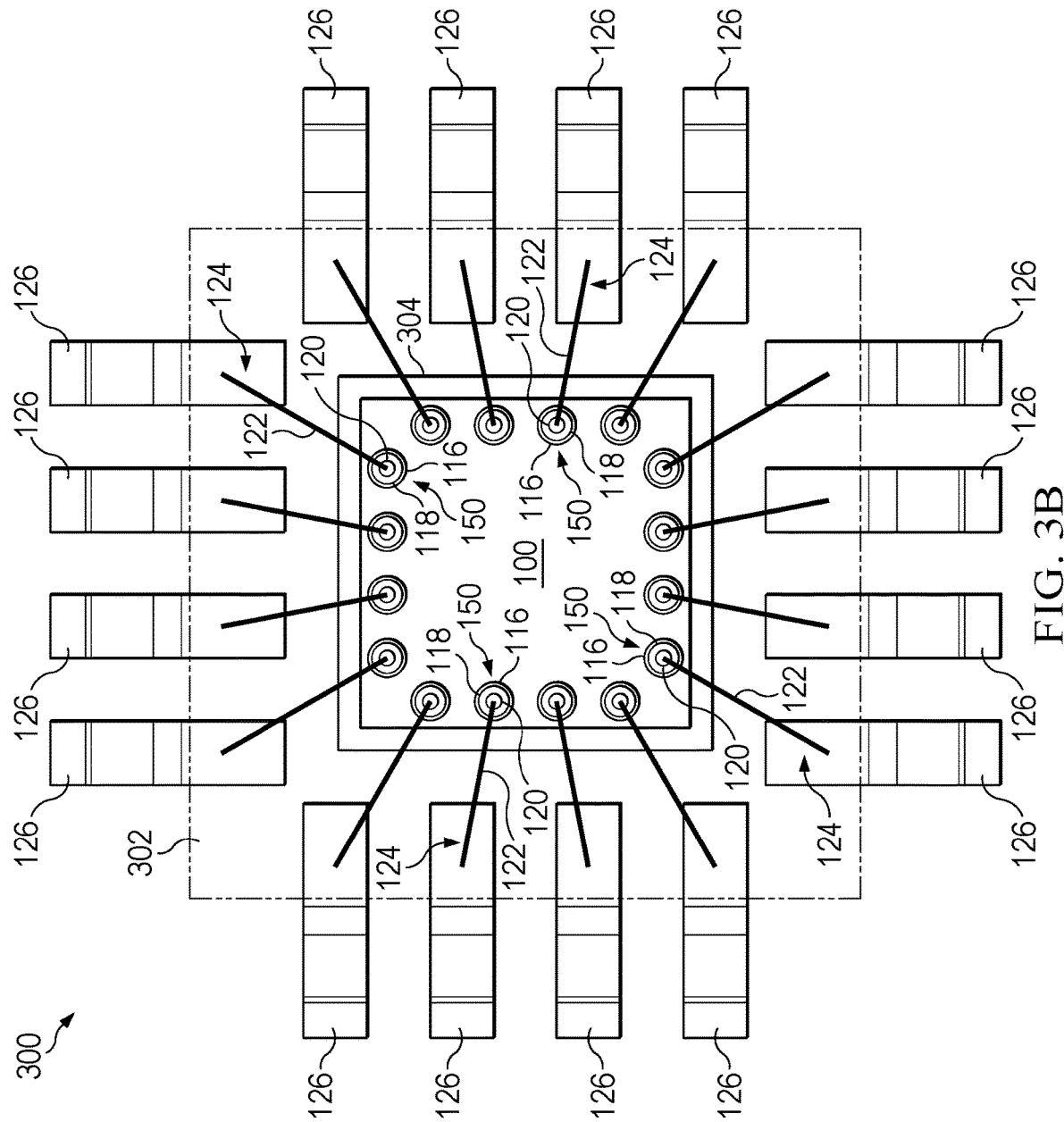
Figure 3C:
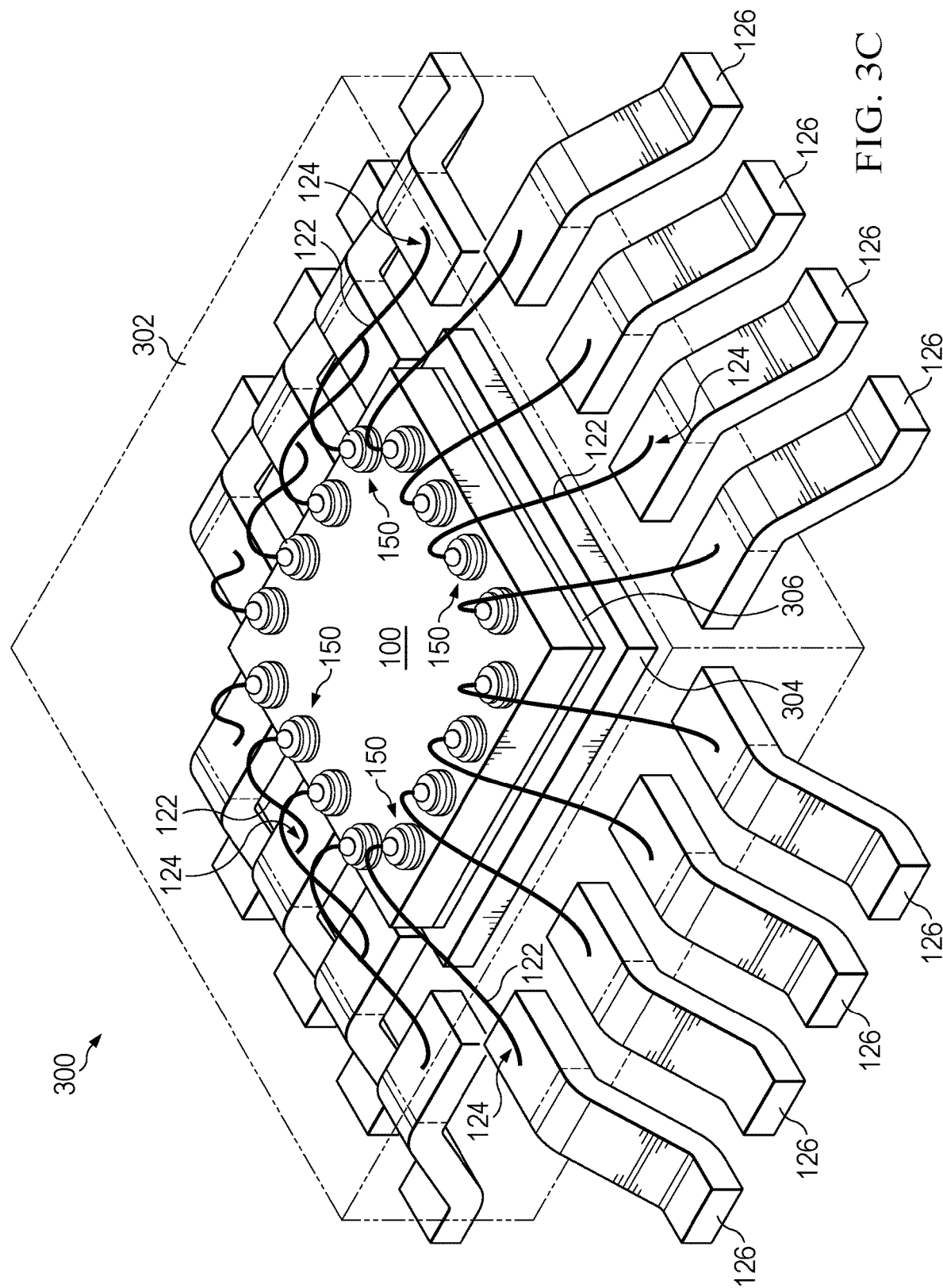

The method 200 includes applying a mold compound to cover the structures of FIG. 1J1 (230), as depicted in FIGS. 3A-3C. FIGS. 3A-3C are cross-sectional, top-down, and perspective views of a leaded semiconductor package having conductive terminals with reduced plating size, in accordance with various examples. Specifically, FIG. 3A shows a semiconductor package 300 having a mold compound 302 that covers a die pad 304, a die attach layer 306, the semiconductor die 100, multiple conductive members 150 on the semiconductor die 100, the ball bonds 120, bond wires 122, stitch bonds 124, and portions of the conductive terminals 126. FIG. 3B is a top-down view of the structure of FIG. 3A. FIG. 3C is a perspective view of the structure of FIG. 3A.

Figure 4A:
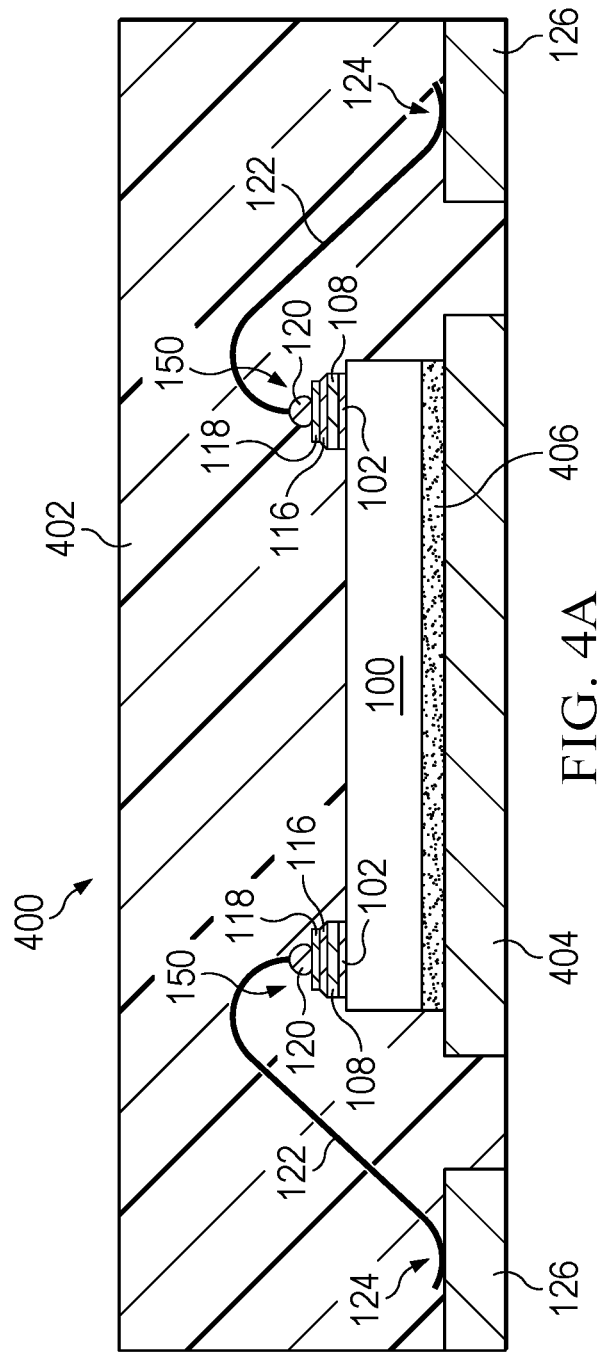
Figure 4C:
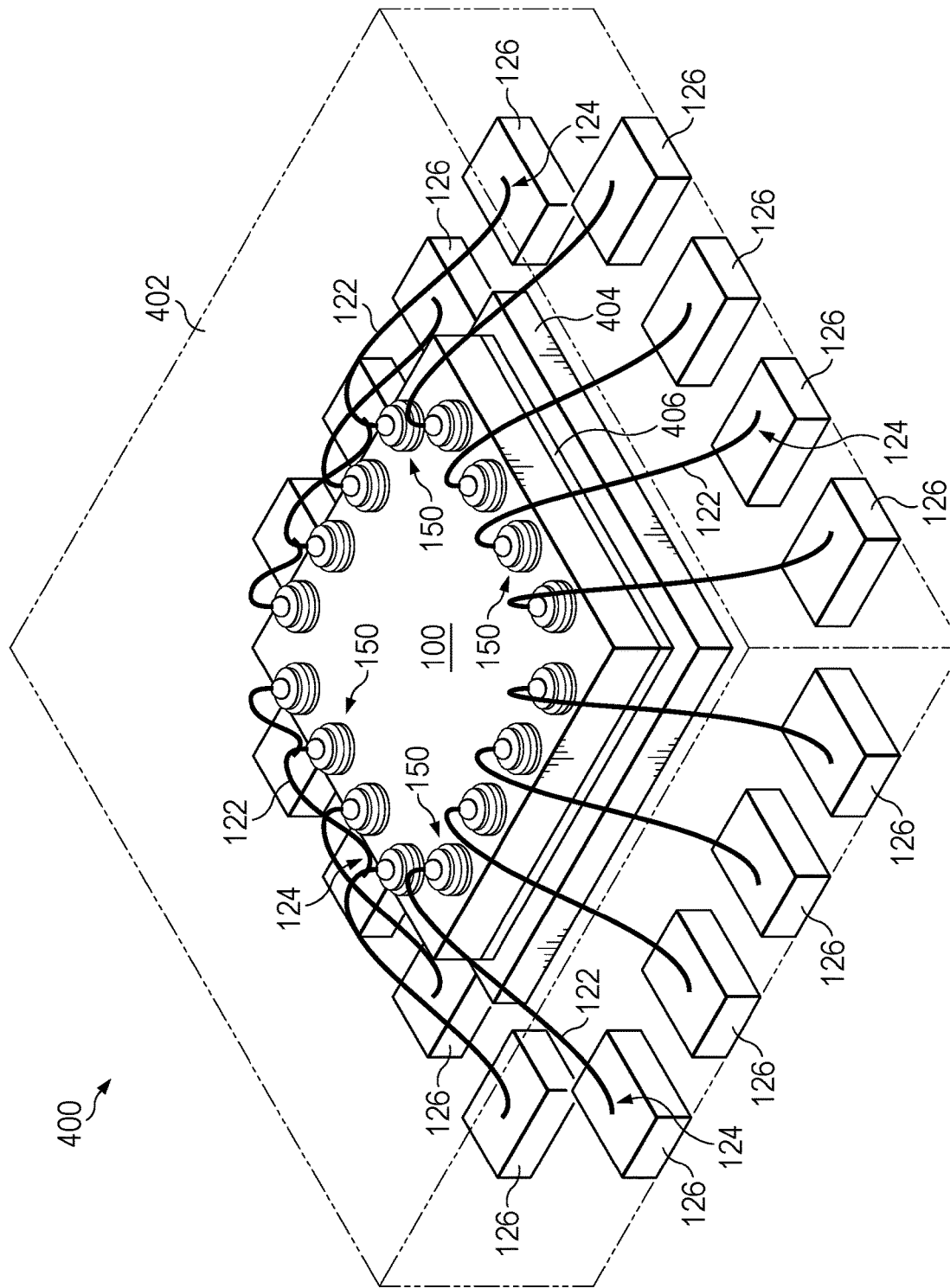

As described above, the conductive member 150 may be useful for implementation in non-leaded semiconductor packages, such as QFN packages. FIGS. 4A-4C are cross-sectional, top-down, and perspective views of a non-leaded semiconductor package (e.g., a QFN package) having conductive terminals with reduced plating size, in accordance with various examples. FIG. 4A shows a semiconductor package 400 having a mold compound 402 covering a die pad 404, a die attach layer 406, the semiconductor die 100, multiple conductive members 150, the ball bonds 120, bond wires 122, stitch bonds 124, and the conductive terminals 126 (which, in this example, are pins instead of leads). FIG.

4B is a top-down view of the structure of FIG. 4A. FIG. 4C is a perspective view of the structure of FIG. 4A.

Figure 5:
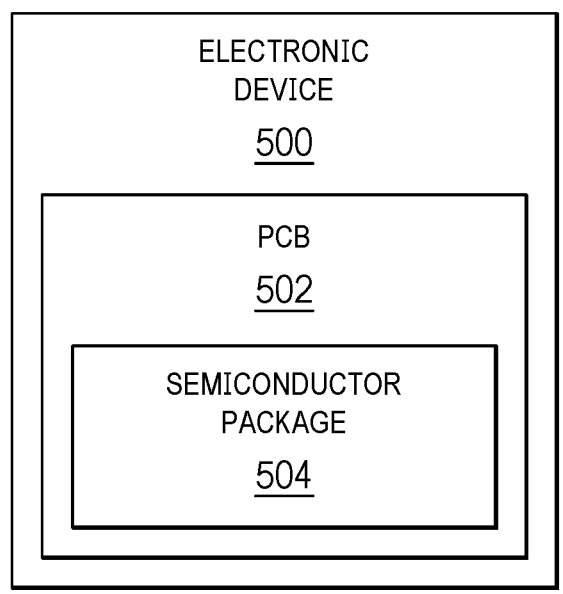
FIG. 5 is a block diagram of an electronic device including a semiconductor package having conductive terminals with reducing plating size, in accordance with various examples.

FIG. 5 is a block diagram of an electronic device 500 including a semiconductor package having conductive terminals with reducing plating size, in accordance with various examples. The electronic device 500 may include a printed circuit board (PCB) 502 to which a semiconductor package 504 is coupled. The semiconductor package 504 is representative of the semiconductor packages 300 and 400 of FIGS. 3A and 4A, respectively. The electronic device 500 may include any suitable device in any suitable application, for example, a laptop computer, desktop computer, smartphone, appliance, entertainment device (e.g., television, stereo system, disc player), automobile, aircraft, spacecraft, etc.

At least one publication has described the techniques described herein as being undesirable. "Enhancing Bump Thick Resist Lithography: Establishing Process Controls to Eliminate Copper Pillar Footing," Plomantes et al., IEEE (2018), describes structures similar to the above-described recessed areas (referred to in the paper as "Cu footing") as a "defect" that "poses electrical and reliability risks such as shorting and Cu migration," and explains how such Cu footing can be "resolved" by using a photoresist development process that is distinct from the process described above in, e.g., method 200 of FIG. 2. Plomantes, Abstract. For instance, to process the photoresist, Plomantes et al. use a first bake temperature of 140 degrees Celsius, light exposure energies of 1800 milli Joules/cm$^2$, a second bake temperature of 100 degrees Celsius, and 8 puddle applications. Thus, Plomantes et al. describe the Cu footing as undesirable and describes specific technical steps by which Cu footing may be eliminated.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A method for manufacturing a semiconductor package, comprising:
    forming a copper member on a surface;
    applying a photoresist to the copper member and the surface;
    forming a cavity in the photoresist above the copper member, the cavity having a first volume with a first diameter and a second volume with a second diameter larger than the first diameter, the second volume more proximal to the copper member than the first volume;
    forming a nickel member in the second volume; and
    forming a palladium member in the first volume.

2. The method of claim 1, wherein forming the copper member comprises electroplating the copper member.

3. The method of claim 1, wherein forming the cavity in the photoresist includes performing a first heating of the photoresist at a temperature ranging from 120 degrees Celsius to 130 degrees Celsius for 14 to 17 minutes.

4. The method of claim 3, wherein forming the cavity in the photoresist includes, after performing the first heating, applying light energy in a range from 1950 milliJoules per centimeter squared to 2050 milliJoules per centimeter squared for 780 to 820 milliseconds per shot to expose the photoresist.

5. The method of claim 4, wherein forming the cavity in the photoresist includes, after performing the exposure, performing a second heating of the photoresist at a temperature ranging from 104 degrees Celsius to 106 degrees Celsius for 3 to 5 minutes.

6. The method of claim 5, wherein forming the cavity in the photoresist includes, after performing the second heating, developing the photoresist by applying developer solution puddles to the photoresist between 10 times and 12 times.

7. The method of claim 1, wherein a top surface of the nickel member facing the palladium member has a first area that is smaller than a second area of a bottom surface of the nickel member facing the copper member.

8. The method of claim 1, wherein a top surface of the nickel member has a first area that is between 90% to 95% of a second area of a bottom surface of the nickel member.

9. The method of claim 1, further comprising coupling a bond wire to the palladium member.

10. A method for manufacturing a semiconductor package, comprising:
    forming a copper member on a surface;
    applying a photoresist to the copper member and the surface;
    performing a first heating of the photoresist at a temperature ranging from 120 degrees Celsius to 130 degrees Celsius for 14 to 17 minutes;
    after performing the first heating, applying light energy in a range from 1950 milliJoules per centimeter squared to 2050 milliJoules per centimeter squared for 780 to 820 milliseconds per shot minutes to expose the photoresist;
    after performing the exposure, performing a second heating of the photoresist at a temperature ranging from 104 degrees Celsius to 106 degrees Celsius for 3 to 5 minutes;
    after performing the second heating, developing the photoresist by applying developer solution puddles to the photoresist between 10 times and 12 times, wherein the performance of the first heating, the exposure, the second heating, and the developing produce a cavity in the photoresist above the copper member, the cavity having a first volume with a first diameter and a second volume with a second diameter larger than the first diameter, the second volume more proximal to the copper member than the first volume;
    forming a nickel member in the second volume; and
    forming a palladium member in the first volume.

11. The method of claim 10, wherein a first area of a top surface of the nickel member is smaller than a second area of a bottom surface of the nickel member.

12. The method of claim 10, wherein the temperature of the first heating is 125 degrees Celsius, the light energy is 2000 milliJoules per centimeter squared, the temperature of the second heating is 105 degrees Celsius, and the developer solution puddles are applied to the photoresist 11 times.

* * * * *